(12) United States Patent
Ehwald et al.

(10) Patent No.: US 6,465,318 B1
(45) Date of Patent: Oct. 15, 2002

(54) BIPOLAR TRANSISTOR AND METHOD FOR PRODUCING SAME

(75) Inventors: Karl-Ernst Ehwald; Bernd Tillack; Bernd Heinemann; Dieter Knoll; Dirk Wolansky, all of Frankfurt (DE)

(73) Assignee: Institut fuer Halbleiterphysik Franfurt (Oder) GmbH, Frankfurt (DE)

(*) Notice: Subject to any disclaimer, the term of this patent is extended or adjusted under 35 U.S.C. 154(b) by 0 days.

(21) Appl. No.: 09/787,571
(22) PCT Filed: Sep. 20, 1999
(86) PCT No.: PCT/DE99/03072
§ 371 (c)(1),
(2), (4) Date: Aug. 2, 2001
(87) PCT Pub. No.: WO00/17933
PCT Pub. Date: Mar. 30, 2000

(30) Foreign Application Priority Data

Sep. 21, 1998 (DE) .......................................... 198 45 793

(51) Int. Cl.[7] .............................................. H01L 21/331
(52) U.S. Cl. ........................ 438/341; 438/353; 438/364
(58) Field of Search ................................. 438/341, 353, 438/364

(56) References Cited

U.S. PATENT DOCUMENTS

| 4,912,538 A | 3/1990 | Kasper |
| 4,935,375 A | 6/1990 | Kasper |

(List continued on next page.)

FOREIGN PATENT DOCUMENTS

| DE | 35 45 238 A1 | 6/1987 |
| DE | 35 45 239 A1 | 6/1987 |

(List continued on next page.)

OTHER PUBLICATIONS

Meyerson, B.S., "Low–Temperature Silicon Epitaxy by Ultrahigh Vacuum' Chemical Vapor Deposition," Appl. Phys. Lett., American Institute of Physics, vol. 48 (No. 12), pp. 797–799, (Mar. 24, 1986).
Burghartz, et al., "Self–Aligned Bipolar Epitaxial Base n–p–n Transistors by Selective Epitaxy Emitter Windoe (SEEW) Technology," IEEE Transactions on Electron Devices, IEEE, vol. 38 (No. 2), pp. 378–385, (Feb. 28, 1991).

(List continued on next page.)

*Primary Examiner*—John F. Niebling
*Assistant Examiner*—Christopher Lattin
(74) *Attorney, Agent, or Firm*—Hahn Loeser + Parks LLP; Stephen L. Grant

(57) ABSTRACT

This invention relates to a bi-polar transistor and a procedure for its manufacture. The task of the invention is to propose a bi-polar transistor and a procedure for its manufacture that eliminates the disadvantages of conventional arrangements for a simple polysilicon technology with differential epitaxy for the manufacture of the base, in order to further improve especially the high-speed properties of a bi-polar transistor, to produce highly conductive connections between the metal contacts and the active (inner) transistor region as well as a minimized passive transistor surface, and to simultaneously avoid any additional process complexity and increased contact resistance. This invention resolves the task in that, by creating suitable epitaxy process conditions, the polysilicon layer is deposited on the insulator zone with a greater thickness than the epitaxy layer in the active transistor zone. The greater thickness of the polysilicon layer as compared to the epitaxial layer is achieved by using a very low temperature for the deposition of a part of or the entire buffer layer. The use of a low temperature for the deposition allows a better nucleation of the insulator layer and a reduction of the idle time for the deposition. This allows achieving a greater thickness on the insulator layer as compared with the active transistor zone.

12 Claims, 1 Drawing Sheet

U.S. PATENT DOCUMENTS

| | | | |
|---|---|---|---|
| 4,949,146 A | | 8/1990 | Herzog |
| 4,997,776 A | * | 3/1991 | Harame et al. ............. 438/313 |
| 5,137,840 A | | 8/1992 | DeSilets |
| 5,234,845 A | | 8/1993 | Aoki |
| 5,436,180 A | | 7/1995 | deFresart |
| 5,488,003 A | | 1/1996 | Chambers |
| 5,604,374 A | | 2/1997 | Inou |
| 5,620,907 A | | 4/1997 | Jalali-Farahani |
| 5,633,179 A | | 5/1997 | Kamins |
| 5,648,280 A | | 7/1997 | Kato |
| 5,656,514 A | * | 8/1997 | Ahlgren et al. ............. 438/320 |
| 5,668,025 A | * | 9/1997 | Blanchard ................... 438/207 |
| 5,821,149 A | | 10/1998 | Schueppen |

FOREIGN PATENT DOCUMENTS

| | | |
|---|---|---|
| DE | 35 45 241 A1 | 6/1987 |
| DE | 35 45 242 A1 | 6/1987 |
| DE | 35 45 243 A1 | 6/1987 |
| DE | 35 45 244 A1 | 6/1987 |
| DE | 37 16 469 A1 | 10/1988 |
| DE | 37 16 470 C2 | 10/1988 |
| DE | 37 16 471 A1 | 10/1988 |
| DE | 37 43 776 A1 | 7/1989 |
| DE | 38 35 700 A1 | 4/1990 |
| DE | 39 03 121 A1 | 8/1990 |
| DE | 39 18 060 A1 | 12/1990 |
| DE | 40 39 104 A1 | 8/1991 |
| DE | 41 15 022 A1 | 12/1991 |
| DE | 44 17 916 A1 | 11/1995 |
| DE | 196 09 933 A1 | 9/1997 |

OTHER PUBLICATIONS

Ugajin, "SiGe Drift Base Bipolar Transistor with Self-Aligned Selective CVD–Tungsten Electrodes," IEEE Transactions on Electron Devices, IEEE, vol. 41 (No. 3), pp. 427–432, (Mar. 30, 1994).

* cited by examiner

BIPOLAR TRANSISTOR AND METHOD FOR PRODUCING SAME

The invention relates to a bi-polar transistor and a procedure for its manufacture.

BACKGROUND OF THE ART

An important domain of use of vertical bi-polar transistors are high-speed applications. In order to improve the efficiency of transistors in the domain of highest speeds, the influence of parasitic components, i.e., resistance and capacitance, must be reduced. Therefore, highly conductive connections between the metal contacts and the active (inner) transistor region as well as a minimized passive transistor surface are required.

In order to meet these requirements, laterally scaled, the so-called "double polysilicon technologies" are used in modem procedures to manufacture vertical bi-polar transistors. Such technologies make it possible to arrange the base contact and parts of the highly conductive polysilicon connection between the contact and the inner base through insulated zones. However, these design advantages as compared with the "simple polysilicon technologies" are associated with such disadvantages as additional process complexity and increased contact resistance. These disadvantages arise in connection with the required etching of the polysilicon in the active zone of the transistor, and the diffusion of the doping agents from the highly doped polysilicon layer into the monocrystal base zone. Since the polysilicon for the base is removed over the active transistor zone by means of a dry-etching procedure, and there is no selectivity to the underlying monocrystal silicon, damage occurs to the exposed silicon surface. The consequence is then roughness of the surface, imperfections of the grid structure and penetration of foreign substances. Various procedures have been suggested to eliminate these problems. For example, etching-stop layers are used to protect the emitter zone in order to resolve the problems with dry etching. Additional procedure and cost is required to guarantee the self-adjusting of,the emitter zone and the etching-stop layer.

The application of epitaxy processes has recently further improved the high-speed properties. In-situ doping is used during the deposition in order to achieve smaller sizes of the base, i.e., smaller thickness of the base layer and smaller base layer resistance. An additional variance in achieving a certain resistance of the base layer and a current gain and, therefore, optimal high-speed properties is provided by the deposition of heterogeneous layers.

The concept of the double polysilicon technology with an etching-stop layer is also applied in the case of an epitaxially deposited base layer using the so-called selective epitaxy. During the selective epitaxy process, the deposition conditions are such that the epitaxial growth occurs only on uncovered semiconductor surface. If differential epitaxy is used, during which the silicon material is deposited both on the semiconductor and the insulator zones, an inner base and the connection to a base contact (base zone) located on the insulator zone can be produced at the same time. This generally eliminates the need of an additional polysilicon layer. The resulting quasi double polysilicon arrangement allows to simplify the process.

However, as compared with a full-fledged double polysilicon process we face a disadvantage consisting in the fact that the thickness of the epitaxy layer in the active transistor zone cannot be set independently from the thickness of the silicon layer in the base zone or on the insulator zones. Due to the insufficient nucleation of the $SiO_2$ layer usually used as insulator, the polycrystal layer is usually thinner than the epitaxially grown layer. As for the epitaxy layer thickness, two different requirements exist. Within the emitter zone, a sufficiently thin layer should be present between the highly doped emitter and the base. A thicker layer is beneficial in the outer base zone to allow low resistance of the base. The patent documentation U.S. Pat. No. 5,137,840A describes differential epitaxy process in a UHVCVD system at a pressure between $1\times10^{-4}$ and $1\times10^{-2}$ Torr and a constant deposition temperature of 500–800° C. for the buffer layer.

The task of this invention is to propose a bi-polar transistor and a procedure for its manufacture that eliminates the disadvantages of conventional arrangements for a simple polysilicon technology with differential epitaxy for the manufacture of the base, in order to further improve especially the high-speed properties of a bi-polar transistor, to produce highly conductive connections between the metal contacts and the active (inner) transistor region as well as a minimized passive transistor surface, and to simultaneously avoid any additional process complexity and increased contact resistance.

SUMMARY OF THE INVENTION

This invention resolves the task in that, by creating suitable epitaxy process conditions, the polysilicon layer is deposited on the insulator zone with a greater thickness than the epitaxy layer in the active transistor zone. The greater thickness of the polysilicon layer as compared to the epitaxial layer is achieved by using a very low temperature for the deposition of a part of or the entire buffer layer. Apart from using a polysilicon layer, this invention also includes the possible use of an amorphous silicon layer. The use of a low temperature for the deposition allows a better nucleation of the insulator layer and a reduction of the idle time for the deposition. The deposition at a very low temperature allows a higher deposition rate for the polycrystal or amorphous layer as compared with the epitaxial layer. This allows achieving a greater thickness on the insulator layer as compared with the active transistor zone.

A simple polysilicon bi-polar transistor with an epitaxially made base according to this invention allows a reduction of the outer base resistance without having to accept a deterioration of the emitter properties. Due to a continuous deposition of the inner and outer zones no surface problems occur with the base.

BRIEF DESCRIPTION OF THE DRAWINGS

The characteristics of this invention follow from the claims as well as from the descriptions and the drawings. Each individual characteristic as well as several characteristics in various combinations represent designs deserving patent protection and such protection is claimed. Design examples of this invention are illustrated by the drawings and are explained in more detail in the following text.

The drawings show.

DETAILED DESCRIPTION OF THE INVENTION

We will now describe this invention in connection with a simple polysilicon process with an epitaxially made base.

Figure 1:
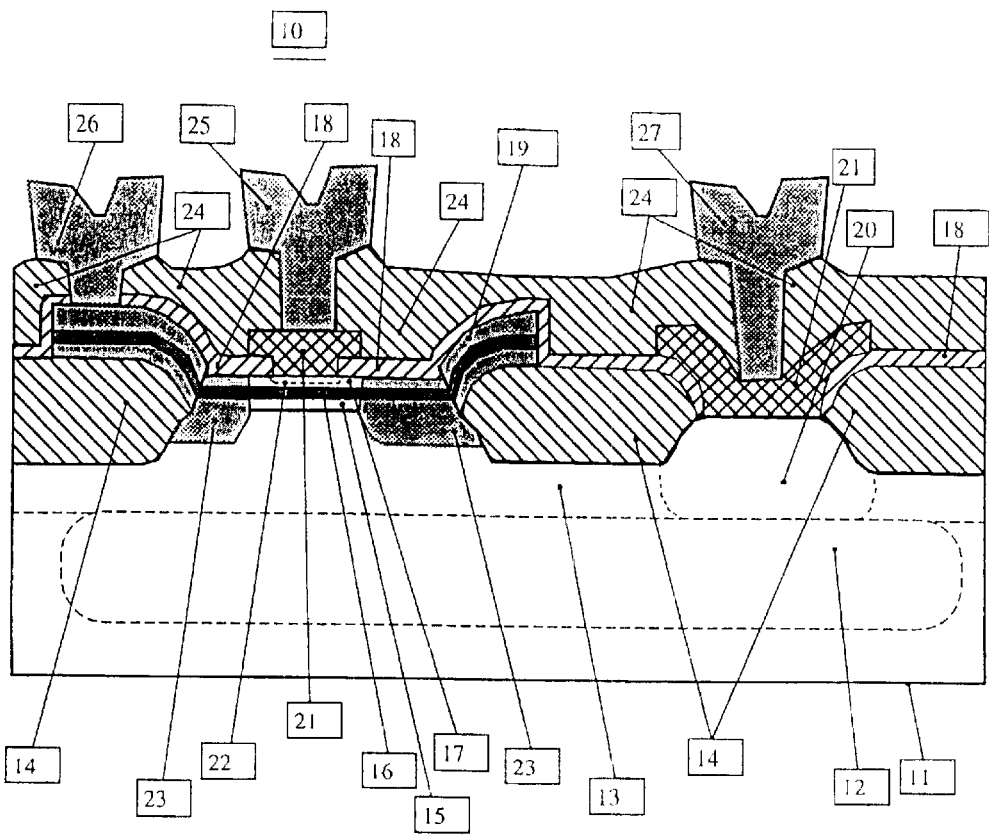
FIG. 1 A schematic illustration of a bi-polar transistor

FIG. 1 schematically shows a bi-polar transistor 10 according to this invention. A collector zone of conductivity type II is made on semiconductor substrate zone 11 of conductivity type I. If the emitter and collector are e.g. n-conductive, the base is of a p-type or vice versa. There exist several known procedures that produce a suitable collector doping. One of them is e.g. the design shown in FIG. 1 with a highly doped buried layer 12 and a less doped epitaxy layer 13. Another version is implanted retrogressive domains. In the example shown here, a field insulation zone 14 separates the bi-polar transistor from other components not shown in FIG. 1, and also separates the collector zone from the active transistor zone. Other suitable insulation techniques are also known such as spaced mesa arrangements. As an option, a shaft implant 20 can be applied in order to reduce the resistance between the contact layer 21 made of highly doped polysilicon and the buried layer 12.

An epitaxy series of layers—consisting of the buffer layer 15, an in-situ doped base layer 16 of conductivity type I, and a cover layer 17—covers the emitter region in the active transistor zone and at least a part of the insulation zone. The epitaxy layer structured outside the active transistor zone is covered with a dielectric 18. Of substantial importance, from the point of view of this invention, is the application of a thick polycrystal layer 19 on the insulator zone. As a variant, an amorphous layer can be used instead of the polycrystal layer 19. The particular values of the thickness, doping agent content as well as the material composition of the base are to be selected depending on the desired functions of the bi-polar transistor and are not subject to any special requirements from the point of this invention. In the example shown, the base layer is made of silicon with a doping of $2 \times 10^{18}$ cm$^{-3}$, and is 40 nm thick. However, other material compositions and doping profiles can be used, too. The application of a thin cover layer 17 over the base layer is possible but not essential for the present invention. The doping of the emitter in a monocrystal silicon is performed by out-diffusion of the doping agent 22 from the highly doped polysilicon contact layer 21. The thickness of the deposited cover layer can be typically 50 nm.

While the buffer, base and cover layers grow on the silicon substrate in monocrystal form, polycrystal layers 19 arise over the insulation zone 14. The thickness of the deposited polycrystal layer is greater than the thickness of the monocrystal layer. Outside the polysilicon contact layer 21, which overlaps the active transistor zone, the doping in the base zone is additionally increased by implantation 23. The insulation layer 24 separates the emitter, base, and collector contact. Metal contacts for emitter 25, base 26 and collector 27 complete the design of the transistor.

In the following text, the manufacture of a bi-polar transistor according to this invention is described by means of two examples.

EXAMPLE 1

Figure 2:
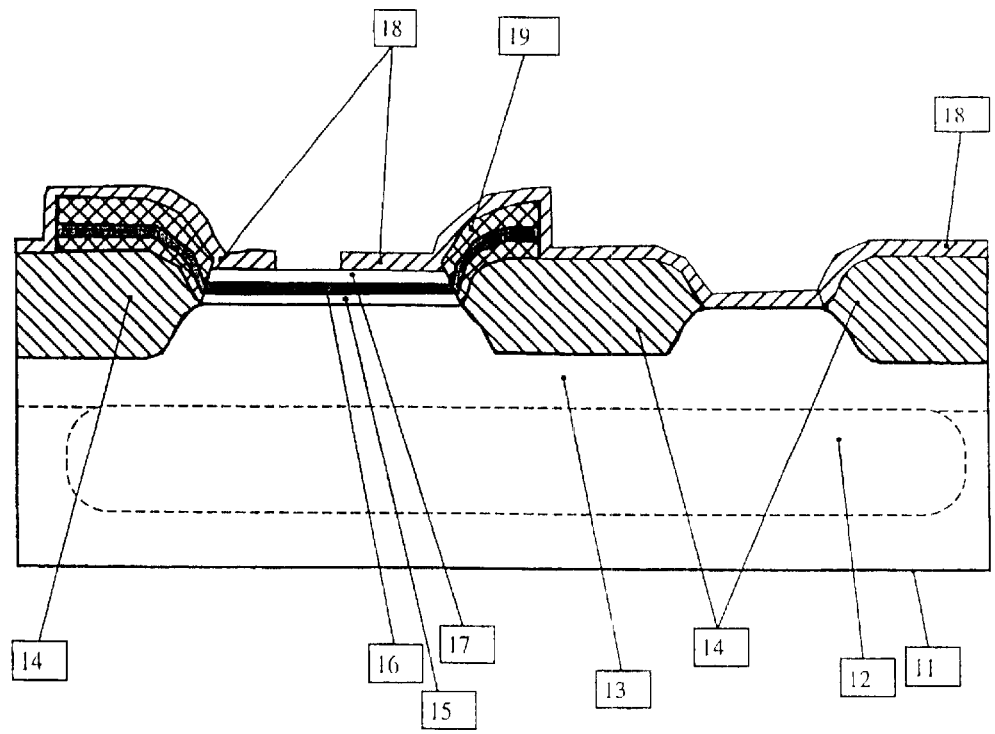
FIG. 2 A schematic illustration of a bi-polar transistor according to FIG. 1 during the manufacture.

FIG. 2 shows the basic structure of the procedure according to this invention. A highly doped n-layer 12 is applied on a p-doped silicon substrate 11 after a photolithographic structuring and layer 12 is subsequently cured. Afterwards, a slightly doped n-layer 13 is deposited by epitaxy. Usual process steps define the active zone and produce insulation zones 14 (e.g. LOCOS) in the remaining zones. First, the buffer layer 15 is deposited by means of differential epitaxy at a very low temperature. A typical example of the deposition temperature is 550° C. At this temperature, the nucleus formation on the insulator zone is improved and the idle time is reduced. The deposition rate of the polycrystal layer is greater than the deposition rate of the epitaxial layer. Subsequently, the base layer 16 and the cover layer 17 are deposited. As a result, the polycrystal layer 19 on the insulator is thicker than the monocrystal layer in the active transistor zone.

After the photolithographic structuring of a mask, the deposited silicon or polysilicon layers are removed in the area of the future transistor and base zones by means of a plasma etching procedure using an etching stop on the insulation zone. A dielectric 18, preferably an oxide, is subsequently applied. By means of a photolithographic structuring of a lacquer mask, the collector zone is now exposed and shaft implant 20 is introduced. After removing this lacquer mask and structuring another lacquer mask, an oxide layer (dielectric 18) is etched, preferably in a wet chemical process, in the collector zone and in the emitter zone. The process continues with the deposition of an amorphous silicon layer. This layer can be doped in-situ by implantation during or after the deposition. The emitter and collector zones are covered by means of a lithographic procedure. In the remaining zones, the amorphous silicon is removed by plasma etching with a stop on the SiO$_2$ layer. During the subsequent implantation of the base zone, the emitter and collector contact zones are protected by the existing masking. After the masking is removed and the arising surface is covered with an oxide, annealing is performed to cure the implantation damage and to form the poly-emitter. The process is completed by opening contact apertures for the emitter, base and collector and a standard metallization for the transistor contacts.

EXAMPLE 2

FIG. 2 shows the basic structure of the procedure according to this invention. A highly doped n-layer 12 is applied on a p-doped silicon substrate 11 after a photolithographic structuring and layer 12 is subsequently cured. Afterwards, a slightly doped n-layer 13 is deposited by epitaxy. Usual process steps define the active zone and produce insulation zones 14 (e.g. LOCOS) in the remaining zones. First, the buffer layer 15 is deposited by differential epitaxy in two steps. In the first step, a very low temperature is used. A typical value for the temperature used is 550° C. At this temperature, the nucleus formation on the insulator zone is improved and the idle time is reduced. The deposition rate of the polycrystal layer is greater than the deposition rate of the epitaxial layer. After the deposition of the first part of the buffer layer, the growth of the buffer layer continues at the same temperature or also at an increased temperature (a typical temperature is 650° C.). Subsequently, the base layer 16 and the cover layer 17 are deposited. As a result, the polycrystal layer 19 on the insulator is thicker than the monocrystal layer in the active transistor zone.

After the photolithographic structuring of a mask, the deposited silicon or polysilicon layers are removed in the area of the future transistor and base zones by means of a plasma etching procedure using an etching stop on the insulation zone. A dielectric 18, preferably an oxide, is subsequently applied. By means of a photolithographic structuring of a lacquer mask, the collector zone is now exposed and shaft implant 20 is introduced. After removing this lacquer mask and structuring another lacquer mask, an oxide layer (dielectric 18) is etched, preferably in a wet chemical process, in the collector zone and in the emitter zone. The process continues with the deposition of an amorphous silicon layer. This layer can be doped in-situ by implantation during or after the deposition. The emitter and collector zones are covered by means of a lithographic procedure. In the remaining zones, the amorphous silicon is removed by plasma etching with a stop on the $SiO_2$ layer. After the arising surface is covered with an oxide, annealing is performed to cure the implantation damage and to form the poly-emitter. The process is completed by opening contact apertures for the emitter, base and collector and a standard metallization for the transistor contacts.

The present invention has explained, by means of concrete examples, a bi-polar transistor and a procedure for its manufacture. However, it must be noted that the present invention is not restricted to the details of the description in the example designs, since alterations and changes are also claimed within this patent, since especially modifications of this process such as hetero-epitaxy or the integration in a bi-polar CMOS (BiCMOS) technology is also possible.

What is claimed is:

1. A procedure for the manufacture of a bi-polar transistor by means of differential epitaxy, during which structured zones consisting of a collector zone and surrounding insulation zones are produced on a monocrystal substrate layer, and a monocrystal series of layers is deposited over the collector zone, characterized in that, during the deposition by setting up suitable deposition conditions the amorphous or polycrystal layer is deposited on the insulator zone in greater thickness than an epitaxial layer in the active transistor zone, where the differential epitaxy for the deposition of the monocrystal series of layers in the emitter zone and of a polycrystal or amorphous series of layers on the insulator zone begins with the creation of a part of a buffer layer on the insulator zone at a very low temperature, and further deposition of the buffer layer continues at a higher temperature.

2. The procedure according to claim 1, characterized in that the first part of the buffer layer consisting of Si is produced on the insulator zone at a temperature in the range 450° C. to 700° C.

3. The procedure according to claim 2, characterized in that the first part of the buffer layer is produced on the insulator zone at a temperature of 550° C.

4. The procedure according to claim 1, characterized in that the first part of the buffer layer is produced on the insulator zone at a temperature of 550° C.

5. The procedure according to claim 1, characterized in that after the creation of the first part of the buffer layer, the deposition continues at a higher temperature in the range of 600° C. to 800° C.

6. The procedure according to claim 2, characterized in that after the creation of the first part of the buffer layer, the deposition continues at a higher temperature in the range of 600° C. to 800° C.

7. The procedure according to claim 6, characterized in that after the creation of the first part of the buffer layer, the deposition continues at a temperature of 650° C.

8. The procedure according to claim 1, characterized in that after the creation of the first part of the buffer layer, the deposition continues at a temperature of 650° C.

9. The procedure according to claim 3, characterized in that after the creation of the first part of the buffer layer, the deposition continues at a higher temperature in the range of 600° C. to 800° C.

10. The procedure according to claim 9, characterized in that after the creation of the first part of the buffer layer, the deposition continues at a temperature of 650° C.

11. The procedure according to claim 4, characterized in that after the creation of the first part of the buffer layer, the deposition continues at a higher temperature in the range of 600° C. to 800° C.

12. The procedure according to claim 11, characterized in that after the creation of the first part of the buffer layer, the deposition continues at a temperature of 650° C.

* * * * *